(12) United States Patent
Williams et al.

(10) Patent No.: US 9,648,270 B2
(45) Date of Patent: May 9, 2017

(54) ELECTRONIC DISPLAY WITH MOUNT-ACCESSIBLE COMPONENTS

(75) Inventors: David Williams, Canton, GA (US); Ware Bedell, Cummings, GA (US); William Dunn, Alpharetta, GA (US)

(73) Assignee: MANUFACTURING RESOURCES INTERNATIONAL, INC., Alpharetta, GA (US)

( * ) Notice: Subject to any disclaimer, the term of this patent is extended or adjusted under 35 U.S.C. 154(b) by 457 days.

(21) Appl. No.: 12/684,608

(22) Filed: Jan. 8, 2010

(65) Prior Publication Data

US 2011/0013367 A1  Jan. 20, 2011

Related U.S. Application Data

(60) Provisional application No. 61/143,189, filed on Jan. 8, 2009.

(51) Int. Cl.
*H05K 7/00* (2006.01)
*H04N 5/64* (2006.01)
(Continued)

(52) U.S. Cl.
CPC ............. *H04N 5/64* (2013.01); *G06F 1/1601* (2013.01); *G06F 1/181* (2013.01); *G06F 2200/1612* (2013.01); *H01L 23/3107* (2013.01); *H01L 23/32* (2013.01); *H01R 23/70* (2013.01); *H01R 23/7005* (2013.01); *H04N 5/63* (2013.01); *H05K 2201/044* (2013.01);
(Continued)

(58) Field of Classification Search
USPC ........ 361/679.15, 679.27, 683, 686; 345/1.1, 345/207; 248/205.1; 340/815.4, 815.47, 340/815.49, 693.5, 693.9; 312/223.2; 348/373, 375, 376; 358/906; 379/428; 396/374; 40/124.01; 463/30, 42, 37; 455/566, 575.3; 600/300; 235/375, 235/462.01

See application file for complete search history.

(56) References Cited

U.S. PATENT DOCUMENTS 5,640,302 A * 6/1997 Kikinis .................... 361/679.41
5,729,289 A * 3/1998 Etoh ........................ 348/333.02
(Continued)

FOREIGN PATENT DOCUMENTS

JP        2008046435      2/2008
KR     1020000021499     4/2000
(Continued)

*Primary Examiner* — Binh Tran
(74) *Attorney, Agent, or Firm* — Standley Law Group LLP

(57) ABSTRACT

An electronic display assembly where the components can be removed and serviced or replaced without having to remove the display from its position. A backplane may be in electrical communication with the image producing assembly and may contain a plurality of blind mate connectors. Various electronic assemblies may be connected to the blind mate connectors. An access panel may provide access to the electronic assemblies so that they can be removed from the housing. N+1 power supplies may be used so that if one fails the unit would continue to operate until the failed power supply could be replaced. The electronic assemblies may be removed from the left side, right side, top, or bottom surfaces of the display housing. Any flat panel electronic display may be used.

2 Claims, 4 Drawing Sheets

(51) Int. Cl.
*G06F 1/16* (2006.01)
*G06F 1/18* (2006.01)
*H05K 5/00* (2006.01)
*H01R 12/50* (2011.01)
*H01L 23/31* (2006.01)
*H01L 23/32* (2006.01)
*H04N 5/63* (2006.01)

(52) U.S. Cl.
CPC ........... *H05K 2201/0999* (2013.01); *H05K 2201/09754* (2013.01); *H05K 2201/1034* (2013.01)

(56) References Cited

U.S. PATENT DOCUMENTS

| | | | |
|---|---|---|---|
| 6,639,790 B2* | 10/2003 | Tsai et al. | 361/679.27 |
| 7,064,672 B2 | 6/2006 | Gothard | |
| 7,589,958 B2* | 9/2009 | Smith | 361/679.02 |
| 7,774,633 B1* | 8/2010 | Harrenstien et al. | 713/323 |
| 2002/0140651 A1* | 10/2002 | Lim et al. | 345/87 |
| 2005/0007500 A1 | 1/2005 | Lin | |
| 2005/0162822 A1 | 7/2005 | Shu | |
| 2007/0267554 A1 | 11/2007 | Tannas | |
| 2008/0002350 A1 | 1/2008 | Farrugia | |
| 2009/0102744 A1* | 4/2009 | Ram | 345/1.1 |

FOREIGN PATENT DOCUMENTS

| | | |
|---|---|---|
| KR | 1020020072633 | 9/2002 |
| KR | 1020030088786 | 11/2003 |
| KR | 1020050023882 | 3/2005 |
| KR | 1020060030424 | 4/2006 |

\* cited by examiner

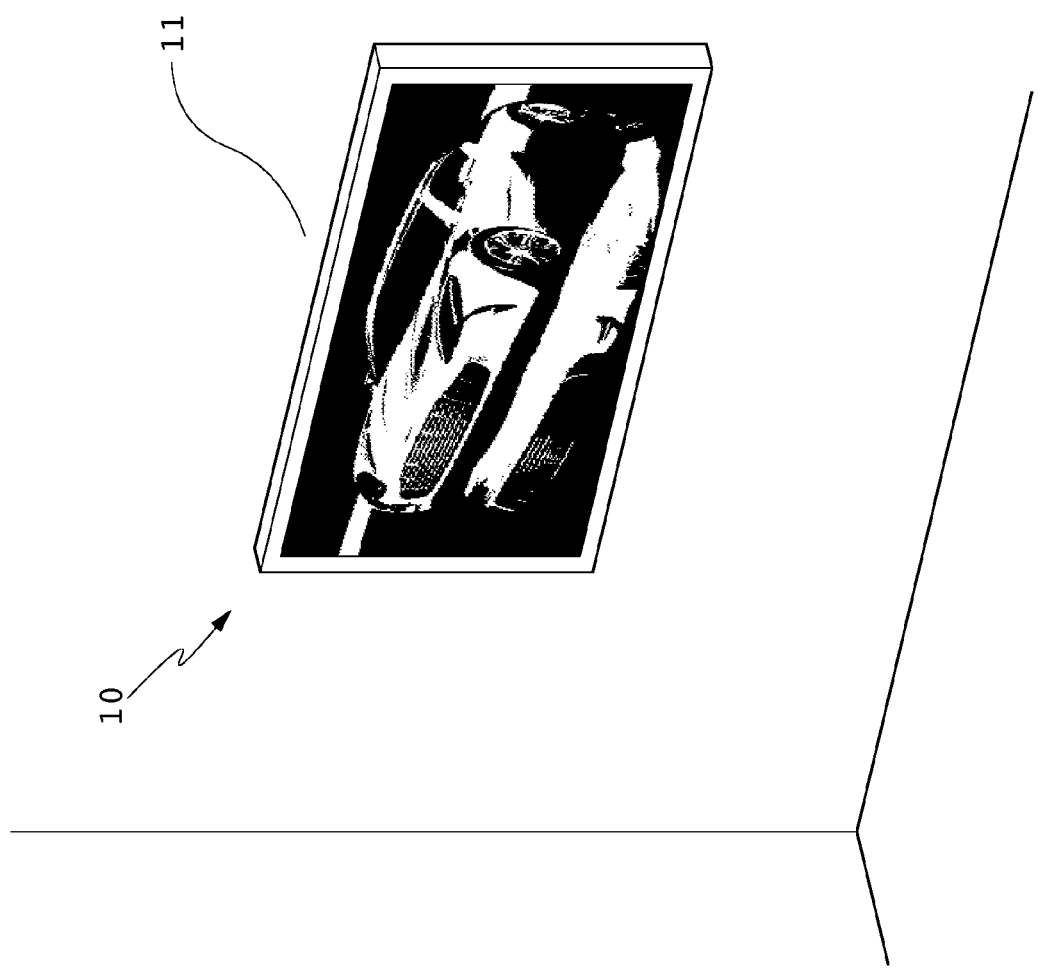

ELECTRONIC DISPLAY WITH MOUNT-ACCESSIBLE COMPONENTS

CROSS-REFERENCE TO RELATED APPLICATIONS

This application is a non-provisional patent application and claims priority to co-pending U.S. Application Ser. No. 61/143,189 filed on Jan. 8, 2009, herein incorporated by reference in its entirety.

TECHNICAL FIELD

Exemplary embodiments relate generally to an electronic display with components which can be removed and replaced without having to remove the display from its mounted position.

BACKGROUND AND SUMMARY OF EXEMPLARY EMBODIMENTS

Electronic displays have become useful for not only indoor entertainment purposes, but are now being utilized for indoor and outdoor advertising/informational purposes. For example, liquid crystal displays (LCDs), plasma displays, and many other flat panel displays are now being used to display information and advertising materials to consumers in locations outside of their own home or within airports, arenas, stadiums, restaurants/bars, gas station pumps, billboards, and even moving displays on the tops of automobiles or on the sides of trucks.

The rapid development of flat panel displays has allowed users to mount these displays in a variety of locations that were not previously available. Further, the popularity of high definition (HD) television has increased the demand for larger and brighter displays, especially large displays which are capable of producing HD video. The highly competitive field of consumer advertising has also increased the demand for large, attention-grabbing, bright displays. Displays which can provide these features typically contain a number of advanced electronic assemblies, which over time, can fail or degrade in performance. Once these displays are mounted in the user's desired position, replacing any failed electronic assemblies can be a costly and time-consuming process. Further, replacement typically requires a 'clean room' environment or further special equipment in order to service the display. Still further, special knowledge and training on the specific technologies at hand is required to trouble-shoot and service these advanced displays.

Exemplary embodiments provide electronic displays which contain electronic assemblies that can be removed, serviced, and/or replaced without having to remove the display from its mounted position. The removable assemblies can be removed through a side of the display housing and may electrically connect to the display using blind mate connectors. N+1 power supplies may be utilized to increase the reliability of the display (where N is the number of power supplies required to run the display).

Embodiments allow a display to be serviced quickly, by minimally-trained personnel while the display remains in its mounted position. The end user may even service the display themselves. Further, a plurality of different display configurations can be sold which are all based on the same display platform. Thus, end users can select the precise components which they desire or even may upgrade original components based on alternative or improved technologies. This may reduce manufacturing costs as display manufacturers may produce only a few base models which can be later adapted to the precise requirements of the end user.

The exemplary embodiments herein disclosed are not intended to be exhaustive or to unnecessarily limit the scope of the embodiments. The exemplary embodiments were chosen and described in order to explain the principles so that others skilled in the art may practice the embodiments. Having shown and described exemplary embodiments, those skilled in the art will realize that many variations and modifications may be made to affect the described invention. Many of those variations and modifications will provide the same result and fall within the spirit of the exemplary embodiments. It is the intention, therefore, to limit the embodiments only as indicated by the scope of the claims.

BRIEF DESCRIPTION OF THE DRAWINGS

A better understanding will be obtained from a reading of the following detailed description and the accompanying drawings wherein identical reference characters refer to identical parts and in which:

FIG. 1A is a perspective illustration of an embodiment in its mounted position;

DETAILED DESCRIPTION OF PREFERRED EMBODIMENTS

FIG. 1A shows an exemplary display 10 which is mounted on vertical surface 11. With traditional displays, when electronic components fail, the display would have to be removed from its mounted positioned, disassembled, and then serviced. Servicing a traditional display may require a host of special equipment and training, and often times a near 'clean room' environment. Embodiments have taken several steps to reduce the time and complexity involved in servicing displays and notably allows them to remain mounted while being serviced.

Figure 1B:
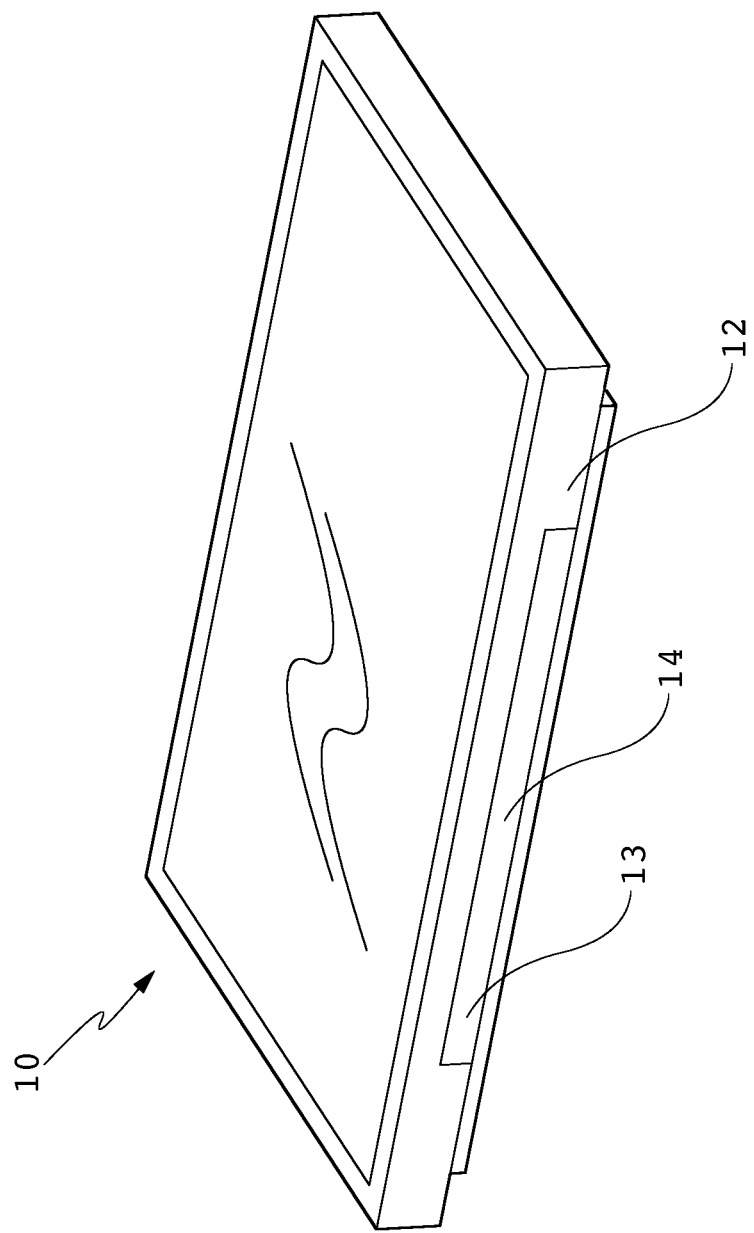
FIG. 1B is a perspective view of the embodiment from FIG. 1A showing the underside of the display housing.

FIG. 1B shows the bottom surface 12 of electronic display 10. An access panel 13 may be used to cover the removable electronic assemblies (see FIG. 1C). The access panel 13 may be secured using lock mechanism 14, which may prevent unauthorized persons from gaining access to the removable electronic assemblies.

Figure 1C:
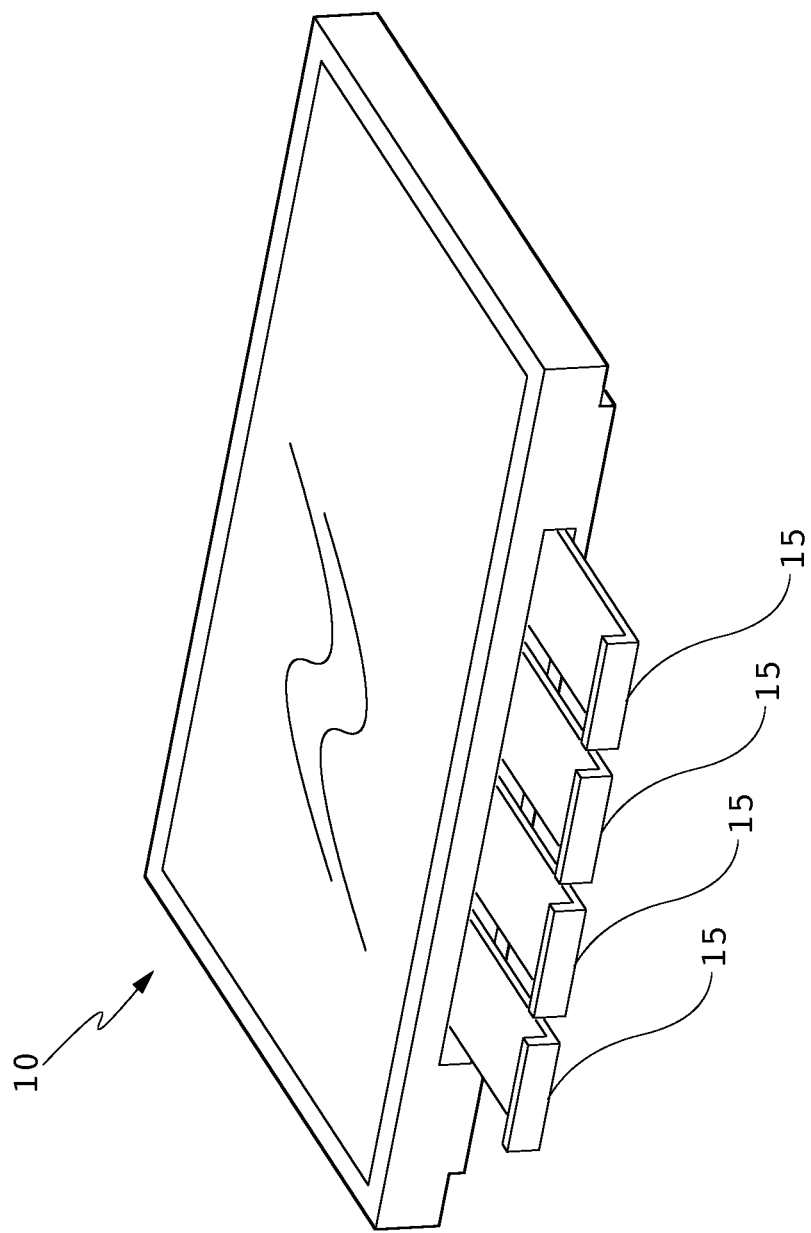
FIG. 1C is a perspective view of the embodiment from FIG. 1B where the access cover has been removed and the removable electronic assemblies are being accessed.

FIG. 1C shows the electronic display from FIGS. 1A and 1B where the electronic assemblies 15 are being removed. The removable electronic assemblies 15 may be any number of electronic assemblies which are known to occasionally fail. These assemblies may include, but not limited to, any one of the following: power supplies, analog/digital (A/D) converters, or timing control units (T-cons).

Figure 2:
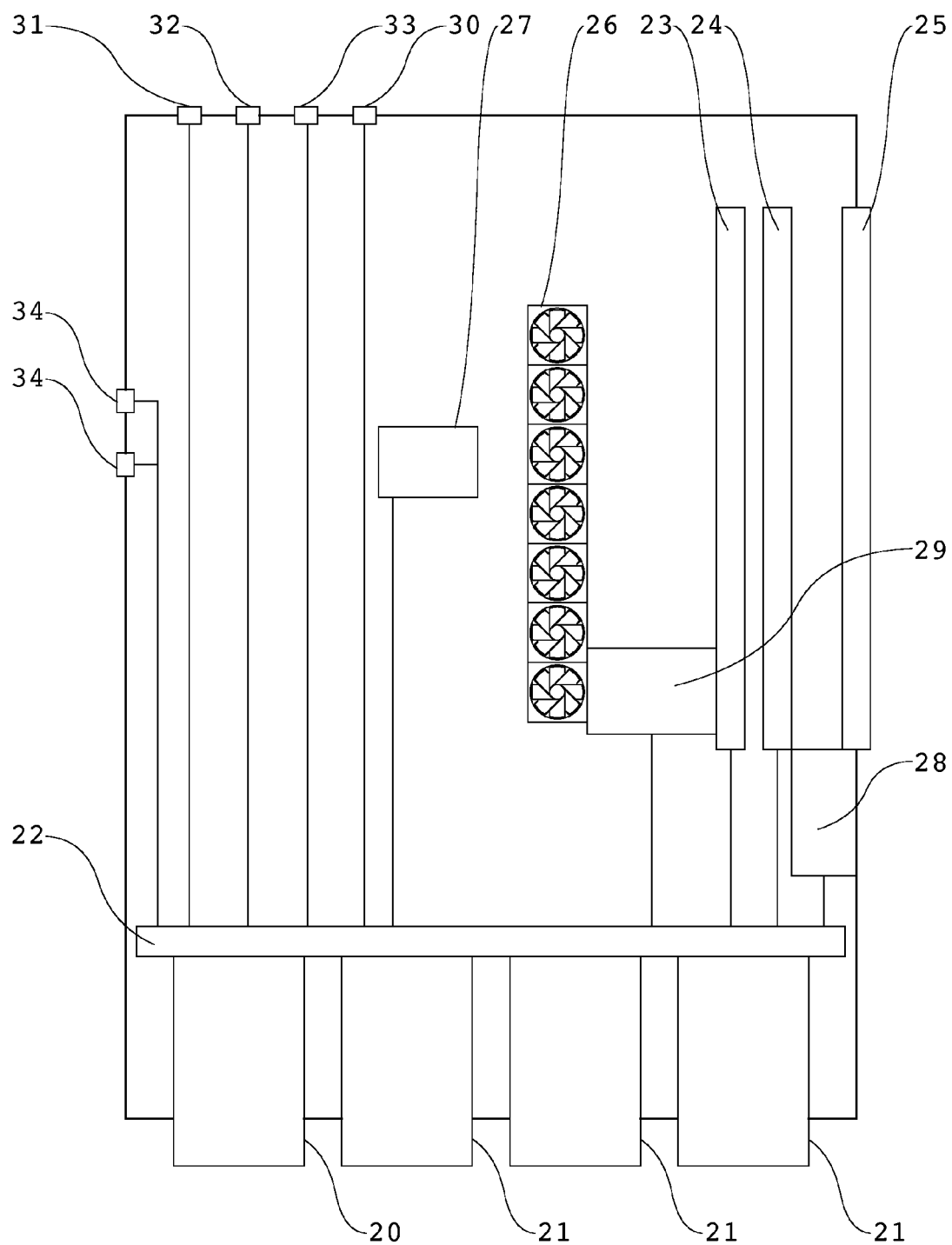
FIG. 2 is a schematic showing the electrical connections for an exemplary embodiment.

FIG. 2 shows the wiring diagram for an exemplary embodiment. In this embodiment, the Tcon has been integrated with the A/D converter into a single display controller assembly 20. This integration allows the complete removal of a LVDS cable which is typically used in traditional displays (which is also known to fail after extended operation). This embodiment shows three separate removable power supplies 21 (or power modules). In a preferred embodiment, the removable power supplies 21 are capable of being hot swapped out of the system while the display is in operation. For large displays using a preferred embodiment, the removable power supplies 21 may supply 24 VDC with 500 Watts.

Using the N+1 technique, only two power supplies may be necessary to run the display shown. Thus, during normal operation only two of the three power supplies 21 will be utilized. However, upon failure of one of the power supplies, the remaining two are adequate to run the display until the failed power supply can be replaced. Communication between the backplane 22 and the display controller assembly 20 may instruct an exterior LED to illuminate in order to provide information to the user that the display needs servicing, and more particularly that one of the power supplies needs replacement. The N+1 technique is extremely useful for displays which provide critical functions and require near constant operation with little or no downtime. It should be noted that the N+1 technique is merely optional, and is not required for the various embodiments. Each of the removable electronic assemblies 20 and 21 may connect with the display backplane 22 using blind-mate connectors.

This figure also shows a backlight 23, LCD assembly 24, and a display panel 25. The backlight 23 may be a CCFL or light emitting diode (LED) backlight. It should be noted that although the setup for an LCD is shown, embodiments can be practiced with any electronic image-producing assembly. Thus any other flat panel display could be used such as plasma, light-emitting polymers, and organic light emitting diode (OLED) displays. A fan assembly 26 is shown for optionally cooling displays which may reach elevated temperatures. One or more temperature sensors 27 may be used to monitor the temperature of the display, and selectively engage fan assembly 26. An ambient light sensor may be used to tailor the output of the backlight 23 for the proper illumination based on the surrounding environment.

A variety of different electrical inputs/outputs are also shown. The AC power input 30 delivers the incoming power to the backplane 22. A video signal input 31 can receive video signals from a plurality of different sources. In a preferred embodiment the video signal input 31 would be an HDMI input. Two data interface connections 32 and 33 are also shown. The first data interface connection 32 may be an RS2332 port or an IEEE 802.3 jack which can facilitate user setup and system monitoring. Either form of the connection should allow electrical communication with a personal computer. The second data interface connection 33 may be a network connection such as an Ethernet port or a wireless connection. The second data interface connection 33 may be utilized to transmit display settings, error messages, and various other forms of data to a website for access and control by the user. Optional audio connections 34 may also be provided for connection to internal or external speaker assemblies.

It should be noted that the wiring diagram shown in FIG. 2 does not require the particular placement and/or wiring of each component which is shown in the figure. The various sensors, electrical connections, and other components are not to scale nor are they required to be placed in the positions shown.

It should also be noted that the combination of the Tcon with the A/D converter and the LVDS cable of a traditional display is not required for the various embodiments. Some embodiments may continue to use these items as separate and either fixed or removable assemblies. The exemplary embodiment shown in FIG. 2 was simply chosen as the most exemplary manner for creating a durable display. Other combinations of removable assemblies with fixed assemblies are particularly contemplated and would be within the scope of the embodiments.

Information for monitoring the status of the various display components may be transmitted through either of the two data interface connections 32 and 33, so that the user can be notified when a component may be functioning improperly, about to fail, or has already failed and requires replacement. Alternatively, or in combination, external indicators on the display may also notify the user that components may need attention. Exterior LEDs, watermarks in the display picture, or other attention-grabbing devices may be used to alert the user to errors within the display. The information for monitoring the status of the display may include, but is not limited to: power supply status, power supply test results, AC input current, temperature sensors, fan speed, video input status, firmware revision, and light level sensors. Also, the user may adjust settings including, but not limited to: on/off, brightness level, enabling ambient light sensor, various alert settings, IP address, customer defined text/video, display matrix settings, display of image settings via OSD, and various software functions. These settings can be monitored and altered from either of the two data interface connections 32 and 33.

As shown herein, the removable electronic assemblies can be easily removed, serviced, and/or replaced without have to remove the display from its mounted position. This saves the user in many ways, including but not limited to: the downtime of the display for servicing, the cost of servicing, the risk of damaging the display by removing it from its mounted position and transporting to an environment suitable for servicing, and the risk of investing in an expensive display which may need to be entirely removed and replaced due to the failure of one small internal component. Further, it permits manufacturers to offer a variety of different types of displays, while only having to manufacture a single base model. Manufacturers can offer a number of different display controller assemblies which can meet a variety of user needs. Users can also upgrade their display controller assemblies as their needs change or as the technology advances. Users may be able to easily remove the old assemblies and install the new assemblies without requiring special equipment or extensive training. Each removable assembly may be held in place with common mechanical fastening means so that removal/installation can be done with commonly available tools and a minimal amount of guidance from the manufacturer. Closing tabs may be used in some embodiments which do not require any tools to release and remove the assembly. Other embodiments may use a more traditional screw or mechanical fastener.

Having shown and described preferred embodiments, those skilled in the art will realize that many variations and modifications may be made to affect the described embodiments and still be within the scope of the claims. Thus, many of the elements indicated above may be altered or replaced by different elements which will provide the same result and fall within the spirit of the claimed embodiments. It is the intention, therefore, to limit the invention only as indicated by the scope of the claims.

What is claimed is:
1. A liquid crystal display comprising:
a liquid crystal stack;
a backlight placed adjacent to the liquid crystal stack;
a backplane in electrical communication with the liquid crystal stack and the backlight, the backplane containing a plurality of blind mate connectors;

an LCD timing and control module connected to the blind mate connectors of the backplane;
a housing containing the liquid crystal stack, backlight, backplane, and LCD timing and control module; and
an access panel within the housing, the access panel located adjacent to the LCD timing and control module and sized to allow the LCD timing and control module to be disconnected from the backplane and removed from the housing.

2. The liquid crystal display of claim 1 further comprising:
a data interface in electrical communication with the backplane and adapted to communicate with a personal computer.

* * * * *